United States Patent
Horii

(10) Patent No.: US 8,698,453 B2
(45) Date of Patent: Apr. 15, 2014

(54) FULL CHARGE CONTROL APPARATUS FOR ONBOARD BATTERY

(75) Inventor: Masaki Horii, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 344 days.

(21) Appl. No.: 13/286,458

(22) Filed: Nov. 1, 2011

(65) Prior Publication Data

US 2012/0293121 A1 Nov. 22, 2012

(30) Foreign Application Priority Data

May 16, 2011 (JP) ................. 2011-109011

(51) Int. Cl.
*H02J 7/00* (2006.01)
(52) U.S. Cl.
USPC ............................ 320/109; 320/150; 320/134
(58) Field of Classification Search
USPC ......................................................... 320/109
See application file for complete search history.

(56) References Cited

U.S. PATENT DOCUMENTS

| 4,125,802 | A  | * | 11/1978 | Godard .......................... 320/150 |
| 4,755,735 | A  | * | 7/1988 | Inakagata ...................... 320/150 |
| 5,493,199 | A  | * | 2/1996 | Koenck et al. ................ 320/106 |
| 5,889,385 | A  | * | 3/1999 | Podrazhansky et al. ....... 320/130 |
| 6,060,862 | A  | * | 5/2000 | Sase et al. ..................... 320/132 |
| 6,583,592 | B2 | * | 6/2003 | Omata et al. .................. 318/139 |
| 8,339,104 | B2 | * | 12/2012 | Tamura ......................... 320/136 |
| 8,479,850 | B2 | * | 7/2013 | Nakata ...................... 180/65.29 |

FOREIGN PATENT DOCUMENTS

JP 6-84754 U 12/1994

* cited by examiner

*Primary Examiner* — Arun Williams
(74) *Attorney, Agent, or Firm* — Sughrue Mion, PLLC

(57) ABSTRACT

A full charge control apparatus includes a temperature detection accuracy decision unit and a full charge decision unit. The temperature detection accuracy decision unit detects an engine speed, a vehicle speed and an ambient temperature and, based on these surrounding conditions, determines whether the difference between the temperature of the battery estimated from a measurement by a temperature sensor and a true battery temperature falls within a specified accuracy range. If the battery temperature measurement accuracy is not within the specified range, the criteria for judging the fully charged state of the battery are modified to ensure that the battery will not be under-charged.

5 Claims, 5 Drawing Sheets

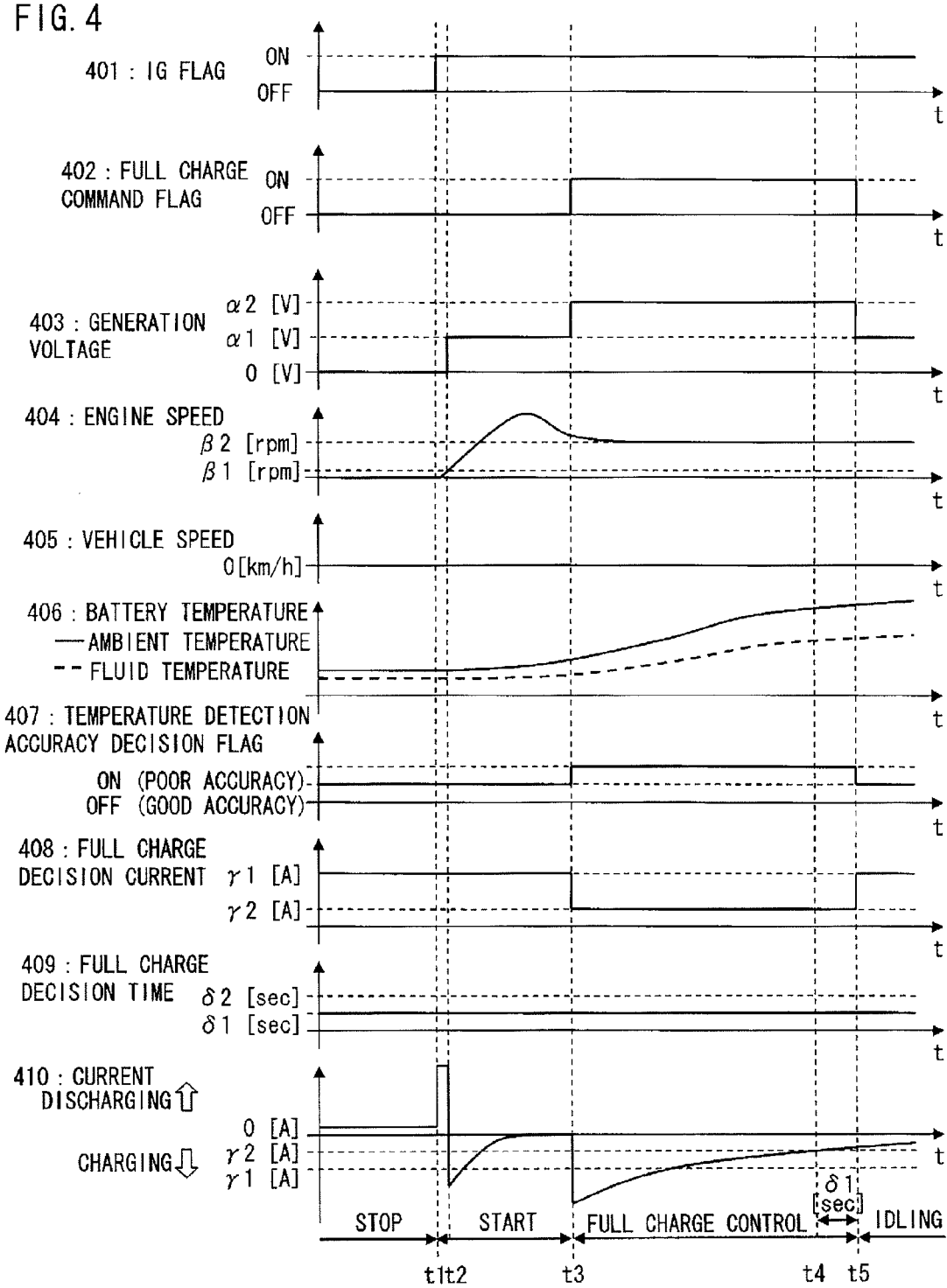

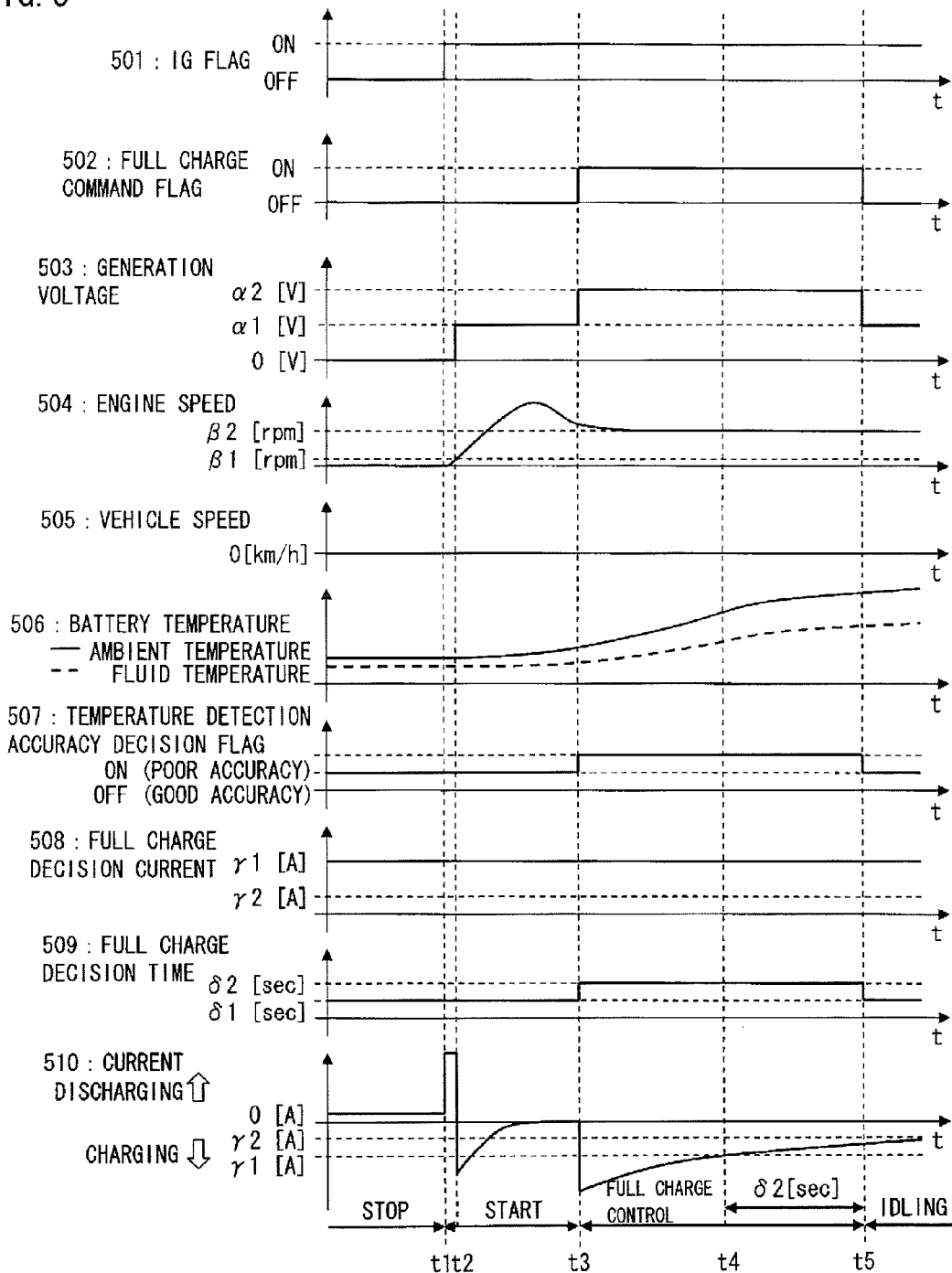

FULL CHARGE CONTROL APPARATUS FOR ONBOARD BATTERY

BACKGROUND OF THE INVENTION

1. Field of the Invention

The present invention relates to a full charge control apparatus installed on a vehicle for controlling an onboard battery which is charged by electric power supplied from a generator driven by an engine.

2. Description of the Background Art

It is possible to increase the capability of acceptance of regenerative energy of a secondary battery while controlling a state of charge (SOC) thereof to a level lower than a full charge capacity (nominal capacity) of the battery. It is known however that this kind of control operation, which is hereinafter referred to as partial-state-of-charge (PSOC) control operation, has one drawback in that the control operation causes the battery to deteriorate. In particular, if the battery is operated under conditions where the state of charge is lower than a tolerable SOC range of the battery, a phenomenon like sulfation which will accelerate deterioration of the battery may occur. To successfully perform the PSOC control operation, it is needed to determine the state of charge of the battery with high accuracy and operate the battery in such a way that the state of charge does not become lower than a lower limit of the tolerable SOC range of the battery.

Methods usable for determining the state of charge of a battery include a current integration method and an open circuit voltage (OCV)-SOC method, for instance. In the current integration method, the battery is fully charged at regular intervals and charging and discharging currents are integrated from each point in time of full charge to determine the state of charge of the battery. Operation for controlling the battery to reach a fully charged state (i.e., full charge control operation) would be to charge the battery up to a point where the following conditions are met: "the charging current becomes equal to or less than a specific value and, in addition, a specific period of time elapses." A method of determining a charge capacity of the battery from current-SOC maps prepared in advance for different battery temperatures is known in the prior art and it is often the case that the operation for bringing the battery to the fully charged state is executed immediately after engine start.

If a charging current to be used for judgment of the fully charged state is set at the same level regardless of temperatures, it is necessary to detect the battery temperature with high accuracy. This is because the state of charge of the battery differs with the battery temperature. In many cases, however, the battery temperature is determined by detecting an ambient temperature of the battery which may potentially differ from a true battery temperature. Thus, it is not usually expected that the battery temperature is detected with high accuracy. In a case where the state of charge of the battery is determined from the detected temperature by using the current-SOC maps prepared for different temperatures, there is a possibility that the state of charge of the battery determined may differ from the actual state of charge if temperature detection accuracy is not high. As a result, if the state of charge at the beginning of SOC calculation, or the state of charge under conditions where the full charge control operation has been executed, is lower than an expected value (e.g., SOC=90% or less), there is such a likelihood that the battery could reach a region in which deterioration of the battery is accelerated.

Under such circumstances, Japanese Laid-open Utility Model Publication No. 1994-84754 proposes a full charge control apparatus for a secondary battery that detects both the temperature of the battery and the ambient temperature thereof and performs the full charge control operation in such a manner that the battery is not wrongly judged to have been fully charged even when the ambient temperature is varying.

Particularly when the state of charge of an onboard battery which is mounted close to a vehicle engine, for instance, is determined from current-SOC maps prepared in advance for different battery temperatures as in conventional cases, there can be a case where the accuracy of detection of the battery temperature deteriorates due to variations in surrounding conditions of the battery according to engine operating conditions. In a case where the state of charge of the battery has become lower than the expected value, there is a possibility that the battery becomes insufficiently charged. Thus, if the battery is operated in the state of charge that is lower than the tolerable SOC range, deterioration of the battery may be accelerated by sulfation, for instance, as mentioned above.

Incidentally, there are cases where the ambient temperature of the battery is affected by the battery temperature. Therefore, if there are transient variations in the surrounding temperature, the battery temperature may rapidly increase near the fully charged state as mentioned in Japanese Laid-open Utility Model Publication No. 1994-84754 cited above. For this reason, the accuracy of battery temperature detection may potentially deteriorate when the difference between the battery temperature and the ambient temperature increases.

SUMMARY OF THE INVENTION

The present invention has been made to overcome the aforementioned problem. Accordingly, it is an object of the invention to provide a full charge control apparatus for an onboard battery that makes it possible to prevent deterioration of the battery caused by insufficient charging even in a case where the accuracy of battery temperature detection has deteriorated.

According to the invention, a full charge control apparatus is installed on a vehicle for controlling full charge operation of an onboard battery which is charged by electric power supplied from a generator driven by an engine, the full charge control apparatus including a current sensor for detecting charging and discharging currents of the battery, a temperature sensor for detecting an ambient temperature of the battery that is used for estimating a true temperature of the battery, a full charge decision unit for determining whether the battery has reached a fully charged state based on a detected value of the charging current fed from the current sensor and a charging time, and a SOC calculator at the time of full charge decision for calculating a state of charge of the battery during judgment of the fully charged state based on the estimated temperature of the battery. The full charge control apparatus further includes a temperature detection accuracy decision unit for detecting a surrounding condition of the battery and, based on a detected value of the surrounding condition, determining whether the difference between the temperature of the battery estimated from the ambient temperature thereof detected by the temperature sensor and the true temperature of the battery falls within a specified accuracy range, and a full charge decision condition controller for adjusting full charge decision conditions in such a manner that the amount of charge to be held in the battery which is one of the full charge decision conditions used by the full charge decision unit when determining whether the battery has reached the fully charged state increases by a specific amount if a judgment result of the temperature detection accuracy decision unit is in the negative.

The full charge control apparatus for the onboard battery according to the present invention is provided with the temperature detection accuracy decision unit and the full charge decision condition controller as mentioned above. The full charge control apparatus thus configured detects the surrounding condition of the battery and, based on the detected value of the surrounding condition, judges whether the difference between the temperature of the battery estimated from the ambient temperature thereof detected by the temperature sensor and the true temperature of the battery falls within the specified accuracy range. If the result of judgment by the temperature detection accuracy decision unit is in the negative, the full charge decision condition controller increases the amount of charge to be held in the battery which is one of the full charge decision conditions used by the full charge decision unit when determining whether the battery has reached the fully charged state by the specific amount. It is therefore possible to deter deterioration of the battery caused by insufficient charging even when battery temperature detection accuracy deteriorates.

The foregoing and other objects, features, aspects and advantages of the present invention will become more apparent from the following detailed description when read in conjunction with the accompanying drawings.

BRIEF DESCRIPTION OF THE DRAWINGS

FIG. 4 is a timing chart depicting full charge control operation according to the first embodiment of the invention; and FIG. 5 is a timing chart depicting full charge control operation according to a second embodiment of the invention.

DETAILED DESCRIPTION OF THE PREFERRED EMBODIMENTS OF THE INVENTION

First Embodiment

Figure 1:
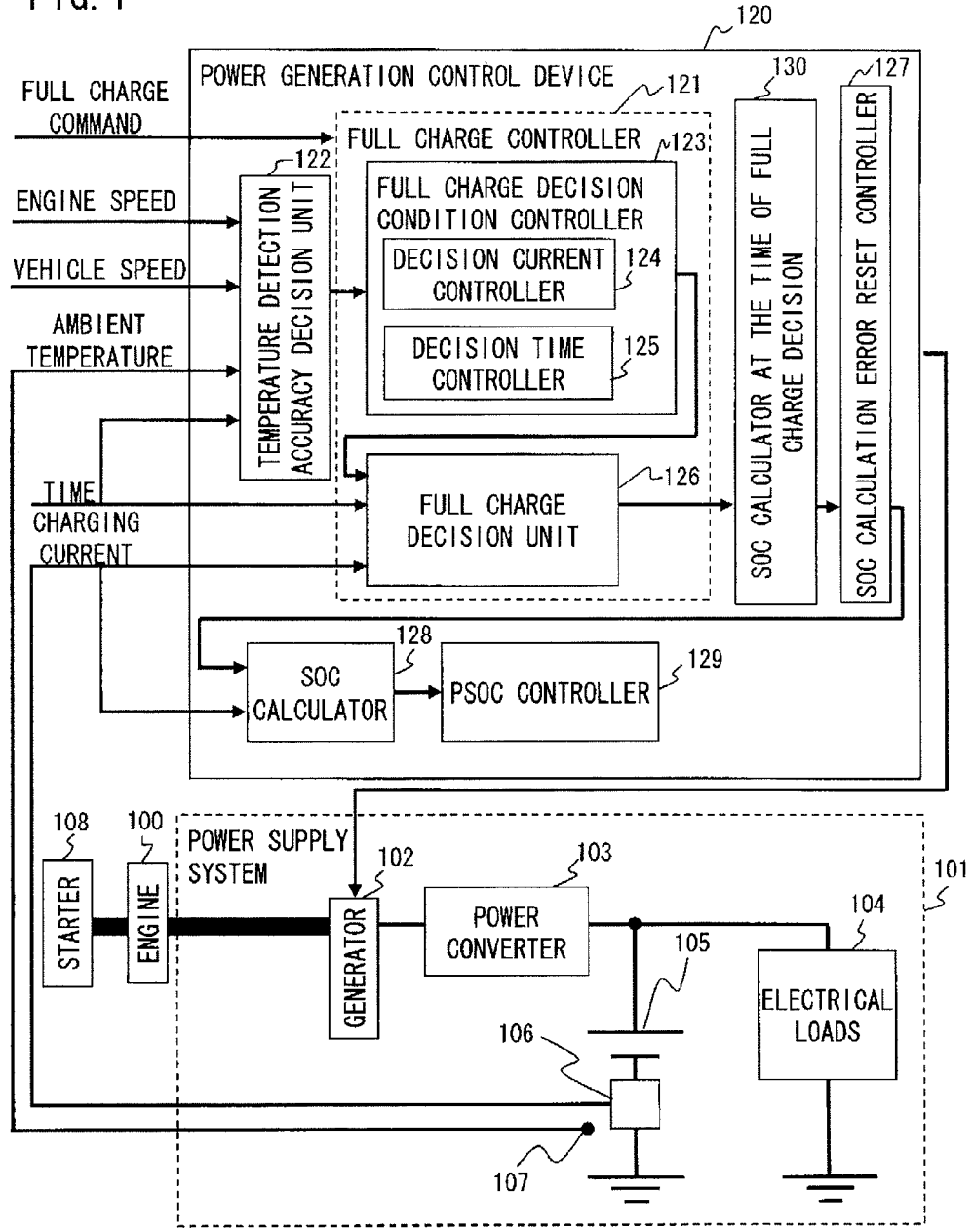
FIG. 1 is a configuration diagram of a full charge control apparatus for an onboard battery according to a first embodiment of the invention.

FIG. 1 is a configuration diagram of a full charge control apparatus for an onboard battery according to a first embodiment of the present invention, in which hardware sections illustrated are elements extracted as being particularly related to the working of the full charge control apparatus described hereinbelow.

An engine 100 mounted on a vehicle is started by a starter 108 and outputs a torque used for turning a generator 102 which constitutes part of a power supply system 101. It is to be noted that FIG. 1 does not illustrate a driving force output system of the engine 100 that is used for producing a driving force for the vehicle.

A power converter 103 converts AC power supplied from the generator 102 into DC power by full-wave rectification of the AC power and supplies the DC power thus obtained to electrical loads 104, such as headlights, an interior lamp and the battery 105. A current sensor 106 detects charging and discharging currents of the battery 105 while a temperature sensor 107 detects an ambient temperature of the battery 105 that is used for estimating a true temperature of the battery 105.

Next, the configuration of a power generation control device 120 including a principal portion of the invention is described. The following discussion provides a description of such part that is conventionally employed, followed by a description of the principal portion of the invention.

Upon receiving a full charge command, a full charge controller 121 initiates execution of full charge control operation for resetting a current integration error which accumulates in the battery 105. A full charge decision unit 126, into which information on a measured time and the charging current of the battery 105 detected by the current sensor 106 is input, makes a decision to determine that a fully charged state has been reached on condition that the charging current has become equal to or smaller than a specific full charge decision current and this state has continued to exist for a specific full charge decision time according to full charge decision conditions specified by a later-described full charge decision condition controller 123. A SOC calculation error reset controller 127 resets the current integration error on condition that the full charge decision unit 126 has determined that the fully charged state has been reached. A SOC calculator 128 calculates the state of charge of the battery 105 by integrating the current detected by the current sensor 106 from a point of the fully charged state. A PSOC controller 129 controls the generator 102 in such a manner that the state of charge calculated by the SOC calculator 128 becomes equal to a desired value.

A temperature detection accuracy decision unit 122 receives input detection values concerning surrounding conditions of the battery 105 and, then, determines whether any of the detection values varies by a specific amount or more within a specific period of time. If the variation in each of the detection values is less than the specific amount, the temperature detection accuracy decision unit 122 determines that the temperature of the battery 105 estimated from a value detected by the temperature sensor 107 is within a permissible accuracy range with respect to the true temperature of the battery 105. If the variation in each of the detection values is equal to or larger than the aforementioned specific amount, the temperature detection accuracy decision unit 122 determines that the estimated temperature is out of the permissible accuracy range. Specifically, in a case where the temperature detection accuracy decision unit 122 determines that the difference between the temperature of the battery 105 estimated from the value detected by the temperature sensor 107 and the true battery temperature has become equal to or larger than the specific amount and it is judged that a state of insufficient charging may potentially occur if the full charge control operation is performed according to the initially set conditions, the temperature detection accuracy decision unit 122 causes the full charge decision condition controller 123 provided in a succeeding stage to control, or adjust, the full charge decision conditions to avoid the state of insufficient charging as will be further discussed later.

In the example of FIG. 1, the temperature detection accuracy decision unit 122 receives the ambient temperature of the battery 105 detected by the temperature sensor 107 as well as an engine speed and a vehicle speed detected by other sensors (not shown) as parameters representing the surrounding conditions of the battery 105. The temperature detection accuracy decision unit 122 determines whether any of detection values varies by an individually preset specific amount.

A reason why the temperature detection accuracy decision unit 122 uses the aforementioned three detection values is as follows. If the amount of change in the ambient temperature is large, there will be a large difference between the temperature of the battery 105 estimated from the value detected by the temperature sensor 107 and the true temperature of the battery 105 because the temperature of the battery 105 rises with some time lag. Also, if the engine speed or the vehicle speed greatly varies, the engine 100 will dissipate a great deal of heat, causing the temperature of the battery 105 to rise. Since this increase in the temperature of the battery 105 caused by heat dissipation from the engine 100 also lags behind an increase in the ambient temperature, it is expected that there will be a large difference between the temperature of the battery 105 estimated from the detected value of the ambient temperature and the true temperature of the battery 105.

Generally, the temperature of a battery expected to be affected by surrounding conditions of the battery in different ways depending on the capacity and structure of the battery as well as a positional relationship between the battery and the engine or the temperature sensor and the body structure of the vehicle. Thus, it should be noted that the parameters representing the surrounding conditions of the battery 105 are not limited to the three detection values including the engine speed, the vehicle speed and the ambient temperature of the battery 105 shown in FIG. 1.

The full charge decision condition controller 123 includes a decision current controller 124 or a decision time controller 125 which controls, or adjusts, the full charge decision conditions according to the result of judgment by the temperature detection accuracy decision unit 122. Details of this function and related operation will be discussed later with reference to FIGS. 3 to 5.

Figure 2:
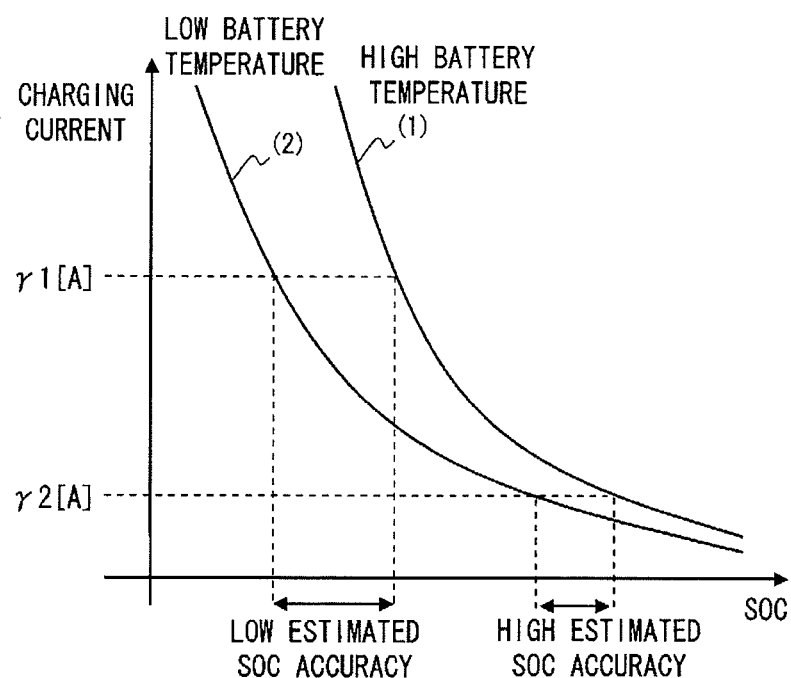
FIG. 2 is a chart depicting characteristic curves representing a relationship between a charging current and a state of charge of the battery in two cases in which the battery has different temperatures.

A relationship between the charging current and the state of charge of the battery 105 is now described with reference to two cases in which the battery 105 has different temperatures as shown in FIG. 2, which is a chart depicting characteristic curves representing the relationship between the charging current (full charge decision current) and the state of charge in a case (1) where the battery temperature is relatively high and in a case (2) where the battery temperature is relatively low.

If the charging current is set at the same value regardless of the battery temperature, the state of charge of the battery 105 differs with the battery temperature. Specifically, the battery 105 has a smaller charge capacity in the case (2) where the battery temperature is low compared to the case (1) where the battery temperature is high as can be seen from FIG. 2.

Therefore, when the amount of change in the engine speed, for instance, becomes large enough to deteriorate the accuracy of battery temperature detection, causing the battery temperature obtained from the value detected by the temperature sensor 107 to become higher than the true battery temperature as mentioned earlier, the charge capacity of the battery 105 becomes smaller as compared to a control value. Also, if a decision current $\gamma 1$ [A] shown in FIG. 2 is varied to a level of a charging current $\gamma 2$ [A] which is lower than the decision current (charging current) $\gamma 1$ [A], the amount of charge to be held in the battery 105 increases, making it possible to suppress battery deterioration.

The full charge control operation is now described below with reference to FIG. 3, which is a flowchart depicting an operating flow of the full charge control operation. When the full charge controller 121 illustrated in FIG. 1 receives the earlier-mentioned full charge command, the power generation control device 120 carries out the below-described operating steps.

In step 301, the temperature detection accuracy decision unit 122 receives the ambient temperature of the battery 105 detected by the temperature sensor 107. The temperature detection accuracy decision unit 122 receives the engine speed based on an input from the engine 100 in step 302 and then receives the vehicle speed in step 303.

In step 304, the temperature detection accuracy decision unit 122 determines whether the difference between the battery temperature estimated from the value detected by the temperature sensor 107 and the true battery temperature falls within the specified accuracy range based on the amount of change in one or more of the detection values concerning the engine speed, the vehicle speed and the ambient temperature of the battery 105 within the specific period of time. If the difference between the estimated battery temperature and the true battery temperature falls within the accuracy range (Yes in step 304), the power generation control device 120 proceeds to step 307 and executes the full charge control operation without varying the initially set full charge decision conditions. If the judgment result is in the negative (No in step 304), on the other hand, the power generation control device 120 proceeds to step 305 or 306.

Step 305 is a processing step to be executed when the full charge decision condition controller 123 includes the decision current controller 124. In this case, the full charge decision condition controller 123 sets the full charge decision current at a specific value which is smaller than an ordinary reference value in step 305. Thus, if the reference value of the full charge decision current is $\gamma 1$ [A], the full charge decision condition controller 123 sets the full charge decision current at the specific value $\gamma 2$ [A] which is made smaller than the reference value $\gamma 1$ [A]. As will be understood from FIG. 2, the amount of charge to be held in the battery 105 increases if the full charge decision current is varied from $\gamma 1$ to $\gamma 2$. A timing chart of FIG. 4 which will be discussed later depicts the full charge control operation performed when the full charge decision condition controller 123 includes the decision current controller 124.

Step 306 is a processing step to be executed when the full charge decision condition controller 123 includes the decision time controller 125. In this case, the full charge decision time is set at a specific value which is larger than an ordinary reference value. Thus, if the reference value of the full charge decision time is $\delta 1$ [s], the full charge decision condition controller 123 sets the full charge decision time at a specific value $\delta 2$ [s] which is larger than the reference value $\delta 1$ in step 306. If the full charge decision time is varied from $\delta 1$ to $\delta 2$, a charge continuation time naturally increases by a corresponding amount, resulting in an increase in the amount of charge to be held in the battery 105. A timing chart of FIG. 5 which will be discussed later as a second embodiment of this invention depicts the full charge control operation performed when the full charge decision condition controller 123 includes the decision time controller 125.

In step 307, the power generation control device 120 performs full charge operation with a generation voltage of the generator 102 increased to a specific value which is larger than an ordinary reference value. If the reference value of the generation voltage is $\alpha 1$ [V], the full charge decision condition controller 123 sets the generation voltage at a specific value $\alpha 2$ [V] which is increased from the reference value $\alpha 1$. If the judgment result in step 304 is in the affirmative (Yes in step 304), the full charge decision condition controller 123 sets the full charge decision current at the reference value $\gamma 1$ [A] thereof and the full charge decision time at the reference value $\delta 1$ [s] thereof and the power generation control device 120 performs the full charge operation at these settings in step 307.

In succeeding step 308, the full charge decision unit 126 determines based on the input information on the charging current and time that the battery 105 has reached the fully charged state (Yes in step 308) on condition that the charging current has become equal to or smaller than the preset full charge decision current and this state has continued to exist for the preset full charge decision time. If the full charge decision unit 126 judges that the battery 105 has not reached the fully charged state (No in step 308), the power generation control device 120 returns to step 307 and continues the full charge operation.

The state of charge of the battery 105 during judgment of the fully charged state is calculated by a SOC calculator at the time of full charge decision 130 from the full charge decision current based on the estimated temperature of the battery 105 used by the full charge decision unit 126 when determining that the battery 105 has reached the fully charged state in step 308.

In step 309, the SOC calculation error reset controller 127 resets the current integration error by resetting a battery SOC value to the state of charge of the battery 105 predetermined above.

Operation performed when the full charge controller 121 has received the full charge command shown in FIG. 1 is now explained with reference to the timing chart of FIG. 4.

Referring to FIG. 4, waveform 401 represents an IG flag, which indicates ON/OFF states of an ignition switch. The IG flag 401 becomes ON at engine start and becomes OFF at engine stop. Waveform 402 represents ON/OFF states of a full charge command flag which becomes ON during execution of the full charge operation and becomes OFF during other than the full charge operation. Waveform 403 represents the generation voltage of the generator 102, waveform 404 represents the engine speed and waveform 405 represents the vehicle speed. Waveform 406 represents the battery temperature in two different terms, that is, the ambient temperature of the battery 105 detected by the temperature sensor 107 and a true fluid temperature (not directly detected) of the battery 105.

Figure 3:
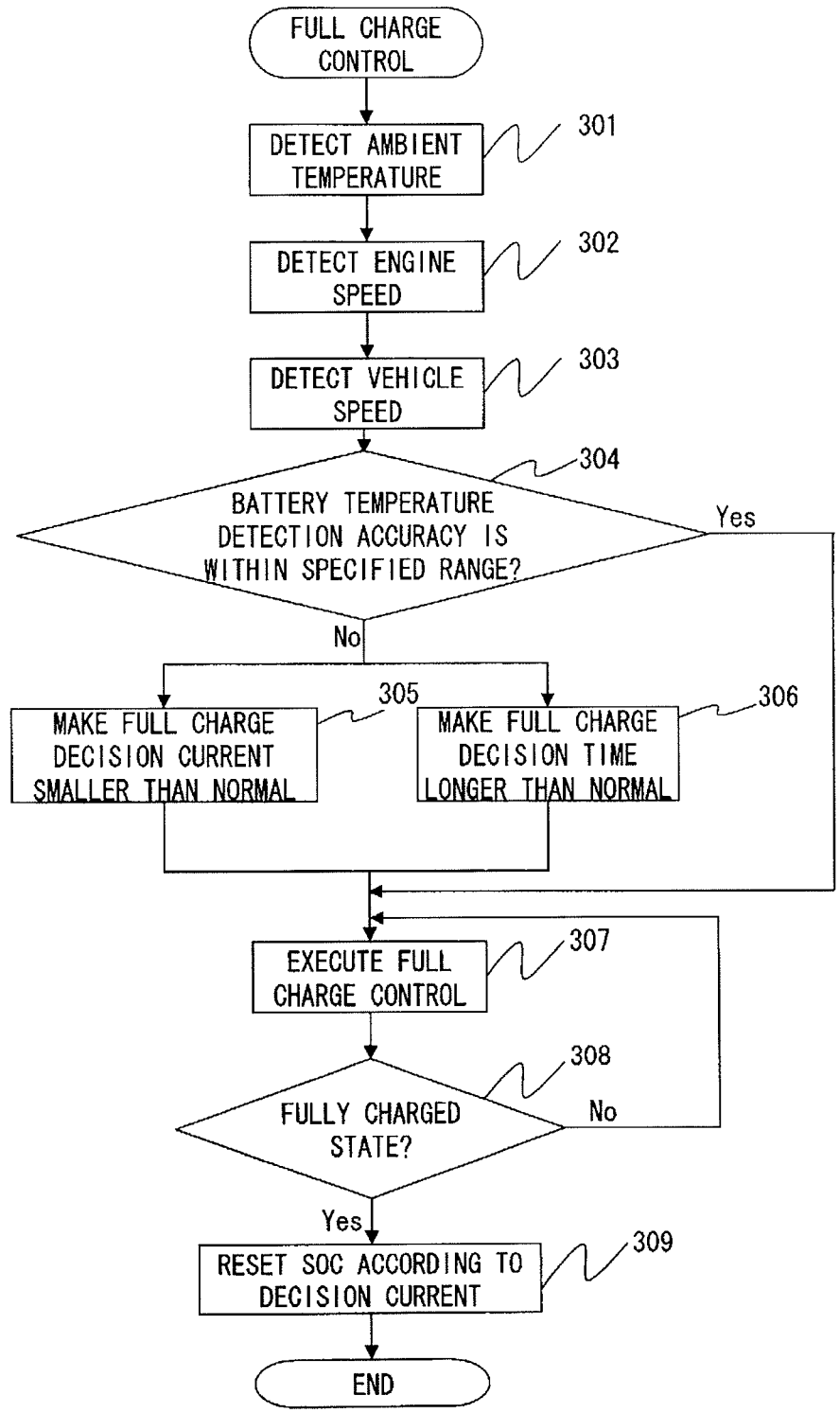
FIG. 3 is a flowchart depicting an operating flow of full charge control operation according to the invention.

Waveform 407 represents ON/OFF states of a temperature detection accuracy decision flag which becomes ON when the temperature detection accuracy is judged to have deteriorated (which corresponds to a case where the judgment result in step 304 of FIG. 3 is in the negative) and becomes OFF when the temperature detection accuracy is judged to be favorable (which corresponds to a case where the judgment result in step 304 is in the affirmative). Waveform 408 represents the full charge decision current which is used when determining whether the battery 105 has reached the fully charged state. Waveform 409 represents the full charge decision time which is used when determining whether the battery 105 has reached the fully charged state. Waveform 410 represents the charging or discharging current of the battery 105 detected by the current sensor 106, positive and negative sides of this waveform 410 representing the discharging and charging currents, respectively.

The engine 100 is at rest before a point in time t1 as can be seen from representations of the engine speed 404 and the vehicle speed 405 in FIG. 4. During a period from time t1 to time t2, the IG flag 401 becomes ON and the engine 100 is started by the starter 108. The ambient temperature of the battery 105 in the battery temperature 406 rises after the engine 100 has started and the battery temperature 406 rises with some time lag owing to a temperature change of the engine 100. The engine speed 404 reaches a startup completion decision engine speed $\beta 1$ [rpm] at time t2 and the generation voltage 403 remains at $\alpha 1$ [V] thereafter. During a period from time t2 to time t3, the "after-startup" engine speed 404 increases.

At time t3 which is a point after engine start, the full charge command flag 402 becomes ON and the full charge control operation commences, so that the generation voltage 403 of the generator 102 rises to $\alpha 2$ [V]. In this example, the temperature detection accuracy decision unit 122 judges that the temperature detection accuracy has deteriorated at this point in time because the engine speed 404 has already varied by the specific amount or more, thereby causing the temperature detection accuracy decision flag 407 to become ON. Consequently, the decision current controller 124 reduces the full charge decision current 408 from the reference value $\gamma 1$ to $\gamma 2$.

During a period from time t3 to time t4, the power generation control device 120 executes the full charge control operation until the battery 105 reaches the fully charged state. In the battery temperature 406, it is to be noted that the difference between the ambient temperature of the battery 105 and the fluid temperature thereof increases during this period. At time t4 the current 410 reaches $\gamma 2$ [A]. During a period from time t4 to time t5, the power generation control device 120 waits until the full charge decision time 409 set to the reference value $\delta 1$ [s] by the full charge decision condition controller 123 elapses after the current 410 has reached $\gamma 2$ [A]. At time t5 the full charge decision unit 126 determines that the battery 105 has reached the fully charged state on condition that the full charge decision time 409 set to the reference value $\delta 1$ [s] has elapsed. When the battery 105 has reached the fully charged state, the full charge command flag 402 becomes OFF, the generation voltage 403 of the generator 102 becomes equal to the reference value $\alpha 1$ [V], the temperature detection accuracy decision flag 407 becomes OFF and the full charge decision current 408 returns to the reference value $\gamma 1$ [A].

The foregoing discussion has described the operation performed when the temperature detection accuracy decision unit 122 judges that the temperature detection accuracy has deteriorated and the decision current controller 124 reduces the full charge decision current 408 from the reference value $\gamma 1$ [A] to $\gamma 2$ [A] to increase the amount of charge to be held in the battery 105 used when determining that the battery 105 has reached the fully charged state. When the temperature detection accuracy is judged to be favorable, however, the full charge decision unit 126 determines whether the battery 105 has reached the fully charged state with the full charge decision current 408 kept unchanged from the reference value $\gamma 1$ [A] and, in this case, the amount of charge to be held in the battery 105 is left at an unincreased value and, thus, at a correspondingly smaller value for calculation purposes. In this case, however, there is no adverse effect that leads to deterioration of the battery 105 because a desired level of full charge estimation accuracy is obtained.

As thus far described, the temperature detection accuracy decision unit 122 detects a change in the battery temperature detection accuracy even when the battery temperature detection accuracy deteriorates due to a large amount of change in any of the engine speed, the vehicle speed and the ambient temperature of the battery 105 which are the surrounding conditions of the battery 105. Upon receiving information on the change in the battery temperature detection accuracy, the decision current controller 124 reduces the set value of the full charge decision current from the reference value $\gamma 1$ [A] to $\gamma 2$ [A] to make the amount of charge to be held in the battery 105 at the end of the full charge control operation larger than normal. Since the power generation control device 120 of the first embodiment of this invention is configured in the aforementioned fashion, it is possible to suppress deterioration of the battery 105 and efficiently prolong the operational life thereof.

Second Embodiment

Now, the full charge control operation performed when the full charge controller 121 illustrated in FIG. 1 receives the full charge command in a case where the full charge decision condition controller 123 includes the decision time controller 125 is described with reference to the timing chart of FIG. 5. The following discussion deals with a case where the power generation control device 120 executes processing step 306 when the judgment result in step 304 is in the negative (No in step 304) in the flowchart of FIG. 3.

Referring to FIG. 5, waveform 501 represents an IG flag, which indicates ON/OFF states of the ignition switch. The IG flag 501 becomes ON at engine start and becomes OFF at engine stop. Waveform 502 represents ON/OFF states of a full charge command flag which becomes ON during execution of the full charge operation and becomes OFF during other than the full charge operation. Waveform 503 represents the generation voltage of the generator 102, waveform 504 represents the engine speed and waveform 505 represents the vehicle speed. Waveform 506 represents the battery temperature in two different terms, that is, the ambient temperature of the battery 105 detected by the temperature sensor 107 and a true fluid temperature (not directly detected) of the battery 105.

Waveform 507 represents ON/OFF states of a temperature detection accuracy decision flag which becomes ON when the temperature detection accuracy is judged to have deteriorated (which corresponds to a case where the judgment result in step 304 of FIG. 3 is in the negative) and becomes OFF when the temperature detection accuracy is judged to be favorable (which corresponds to a case where the judgment result in step 304 is in the affirmative). Waveform 508 represents the full charge decision current which is used when determining whether the battery 105 has reached the fully charged state. Waveform 509 represents the full charge decision time which is used when determining whether the battery 105 has reached the fully charged state. Waveform 510 represents the charging or discharging current of the battery 105 detected by the current sensor 106, positive and negative sides of this waveform 510 representing the discharging and charging currents, respectively.

The engine 100 is at rest before a point in time t1 as can be seen from representations of the engine speed 504 and the vehicle speed 505 in FIG. 5. During a period from time t1 to time t2, the IG flag 501 becomes ON and the engine 100 is started by the starter 108. The ambient temperature of the battery 105 in the battery temperature 506 rises after the engine 100 has started and the battery temperature 406 rises with some time lag owing to a temperature change of the engine 100. The engine speed 504 reaches a startup completion decision engine speed $\beta 1$ [rpm] at time t2 and the generation voltage 503 remains at $\alpha 1$ [V] thereafter. During a period from time t2 to time t3, the "after-startup" engine speed 504 increases.

At time t3 which is a point after engine start, the full charge command flag 502 becomes ON and the full charge control operation commences, so that the generation voltage 503 of the generator 102 rises to $\alpha 2$ [V]. In this example, the temperature detection accuracy decision unit 122 judges that the temperature detection accuracy has deteriorated at this point in time because the engine speed 504 has already varied by the specific amount or more, thereby causing the temperature detection accuracy decision flag 507 to become ON. Consequently, the decision time controller 125 lengthens the full charge decision time 509 from the reference value $\delta 1$ to $\delta 2$.

During a period from time t3 to time t4, the power generation control device 120 executes the full charge control operation until the battery 105 reaches the fully charged state. In the battery temperature 506, it is to be noted that the difference between the ambient temperature 506 of the battery 105 and the fluid temperature thereof increases during this period. At time t4 the current 510 reaches the reference value $\gamma 1$ [A]. During a period from time t4 to time t5, the power generation control device 120 waits until the full charge decision time 509 set to the specific value $\delta 2$ [s] by the full charge decision condition controller 123 elapses after the current 510 has reached $\gamma 1$ [A]. At time t5 the full charge decision unit 126 determines that the battery 105 has reached the fully charged state on condition that the full charge decision time 509 set to the specific value $\delta 2$ [s] has elapsed. When the battery 105 has reached the fully charged state, the full charge command flag 502 becomes OFF, the generation voltage 503 of the generator 102 becomes equal to the reference value $\alpha 1$ [V], the temperature detection accuracy decision flag 507 becomes OFF and the full charge decision time 509 returns to the reference value $\delta 1$ [s].

The foregoing discussion of the second embodiment has described the operation performed when the temperature detection accuracy decision unit 122 judges that the temperature detection accuracy has deteriorated and the decision time controller 125 lengthens the full charge decision time 509 from the reference value $\delta 1$ [s] to $\delta 2$ [s] to increase the amount of charge to be held in the battery 105 used when determining that the battery 105 has reached the fully charged state. When the temperature detection accuracy is judged to be favorable, however, the full charge decision unit 126 determines whether the battery 105 has reached the fully charged state with the full charge decision time 409 kept unchanged from the reference value $\delta 1$ [s] and, in this case, the amount of charge to be held in the battery 105 is left at an unincreased value and, thus, at a correspondingly smaller value for calculation purposes. In this case, however, there is no adverse effect that leads to deterioration of the battery 105 because a desired level of full charge estimation accuracy is obtained.

As thus far described, the temperature detection accuracy decision unit 122 detects a change in the battery temperature detection accuracy even when the battery temperature detection accuracy deteriorates due to a large amount of change in any of the engine speed, the vehicle speed and the ambient temperature of the battery 105 which are the surrounding conditions of the battery 105. Upon receiving information on the change in the battery temperature detection accuracy, the decision time controller 125 lengthens the set value of the full charge decision time from the reference value $\delta 1$ [s] to $\delta 2$ [s] to make the amount of charge to be held in the battery 105 at the end of the full charge control operation larger than normal. Since the power generation control device 120 of the second embodiment of this invention is configured in the aforementioned fashion, it is possible to suppress deterioration of the battery 105 and efficiently prolong the operational life thereof.

While the foregoing first and second embodiments have revealed two different configurations in which the full charge decision condition controller 123 includes the decision current controller 124 and the full charge decision condition controller 123 includes the decision time controller 125, respectively, the full charge decision condition controller 123 may be reconfigured to include a decision current/time controller adapted to control, or adjust, both the full charge decision current and the full charge decision time. In this modified form of the invention, the decision current/time controller can set the full charge decision current used for judging the fully charged state of the battery 105 at a value smaller than the reference value and the full charge decision time used for judging the fully charged state of the battery 105 at a value larger than the reference value so that the amount of charge to be held in the battery 105 which is one of the full charge decision conditions can be increased by a specific amount. In this case, a ratio between the amount of change in the full charge decision current and that in the full charge decision time may be determined as appropriate according to properties of the battery 105 used, for instance.

Various modifications and alterations of this invention will be apparent to those skilled in the art without departing from the scope and spirit of this invention, and it should be understood that this is not limited to the illustrative embodiments set forth herein.

What is claimed is:

1. A full charge control apparatus installed on a vehicle for controlling full charge operation of an onboard battery which is charged by electric power supplied from a generator driven by an engine, said full charge control apparatus comprising:
   a current sensor for detecting charging and discharging currents of said battery;
   a temperature sensor for detecting an ambient temperature of said battery that is used for estimating a true temperature of said battery;
   a full charge decision unit for determining whether said battery has reached a fully charged state based on a detected value of the charging current fed from said current sensor and a charging time;
   a SOC calculator at the time of full charge decision for calculating a state of charge of said battery during judgment of the fully charged state based on the estimated temperature of said battery;
   a temperature detection accuracy decision unit for detecting a surrounding condition of said battery and, based on a detected value of the surrounding condition, determining whether the difference between the temperature of said battery estimated from the ambient temperature thereof detected by said temperature sensor and the true temperature of said battery falls within a specified accuracy range; and
   a full charge decision condition controller for adjusting full charge decision conditions in such a manner that the amount of charge to be held in said battery which is one of the full charge decision conditions used by said full charge decision unit when determining whether said battery has reached the fully charged state increases by a specific amount if a judgment result of said temperature detection accuracy decision unit is in the negative.

2. The full charge control apparatus according to claim 1, wherein said temperature detection accuracy decision unit judges that the difference between the estimated temperature and the true temperature of said battery does not fall within the specified accuracy range if one of an engine speed, a vehicle speed and a detected value of the ambient temperature of said battery fed from said temperature sensor has varied by at least a specific set value.

3. The full charge control apparatus according to claim 2, wherein said full charge decision condition controller includes a decision current controller which increases the amount of charge to be held in said battery which is one of the full charge decision conditions by the specific amount by setting a full charge decision current used for judging the fully charged state of said battery at a value smaller than a reference value thereof if said temperature detection accuracy decision unit judges that the difference between the estimated temperature and the true temperature of said battery does not fall within the specified accuracy range.

4. The full charge control apparatus according to claim 2, wherein said full charge decision condition controller includes a decision time controller which increases the amount of charge to be held in said battery which is one of the full charge decision conditions by the specific amount by setting a full charge decision time used for judging the fully charged state of said battery at a value larger than a reference value thereof if said temperature detection accuracy decision unit judges that the difference between the estimated temperature and the true temperature of said battery does not fall within the specified accuracy range.

5. The full charge control apparatus according to claim 2, wherein said full charge decision condition controller includes a decision current/time controller which increases the amount of charge to be held in said battery which is one of the full charge decision conditions by the specific amount by setting a full charge decision current used for judging the fully charged state of said battery at a value smaller than a reference value thereof and a full charge decision time used for judging the fully charged state of said battery at a value larger than a reference value thereof if said temperature detection accuracy decision unit judges that the difference between the estimated temperature and the true temperature of said battery does not fall within the specified accuracy range.

* * * * *